United States Patent
Shimizu et al.

(10) Patent No.: US 7,869,265 B2
(45) Date of Patent: Jan. 11, 2011

(54) MAGNETIC RANDOM ACCESS MEMORY AND WRITE METHOD OF THE SAME

(75) Inventors: Yuui Shimizu, Yokohama (JP); Tatsuya Kishi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 528 days.

(21) Appl. No.: 12/026,077

(22) Filed: Feb. 5, 2008

(65) Prior Publication Data

US 2008/0186759 A1     Aug. 7, 2008

(30) Foreign Application Priority Data

Feb. 6, 2007   (JP)   ............... 2007-027029

(51) Int. Cl.
*G11C 11/00*   (2006.01)

(52) U.S. Cl. ............... 365/158; 365/130; 365/171; 365/173; 365/225.5; 365/243.5

(58) Field of Classification Search ............... 365/48, 365/55, 62, 66, 74, 78, 80–93, 100, 130, 365/131, 148, 158, 171–173, 225.5, 243.5; 216/22; 257/421, E21.665; 438/3; 428/810–816, 428/817–825.1, 826; 977/933–935

See application file for complete search history.

(56) References Cited

U.S. PATENT DOCUMENTS

| 6,731,535 | B1 | 5/2004 | Ooishi et al. |
| 2004/0017721 | A1 | 1/2004 | Schwabe et al. |

(Continued)

FOREIGN PATENT DOCUMENTS

JP   2006-128579   5/2006

(Continued)

OTHER PUBLICATIONS

T. Kawahara, et al., " 2Mb Spin-Transfer Torque RAM (SPRAM) with Bit-by-Bit Bidirectional Current Write and Parallelizing-Direction Current Read", 2007 IEEE International Solid-State Circuits Conference, ISSCC Digest of Technical Papers, Session 26, Non-Volatile Memories, 26.5, Feb. 14, 2007, pp. 480-481 and p. 617.

(Continued)

*Primary Examiner*—Richard Elms
*Assistant Examiner*—Harry W Byrne
(74) *Attorney, Agent, or Firm*—Oblon, Spivak, McClelland, Maier & Neustadt, L.L.P.

(57) ABSTRACT

A magnetic random access memory includes a first interconnection extending to a first direction, a second interconnection extending to a second direction perpendicular to the first direction, a magnetoresistive effect element formed between the first and second interconnections, having one terminal connected to the first interconnection, includes a fixed layer, a recording layer and a nonmagnetic layer, a film thickness of the fixed layer being larger than that of the recording layer, and a width of the fixed layer being larger than that of the recording layer, and configured to reverse a magnetization direction in the recording layer by supplying a first electric current between the fixed layer and the recording layer, and a diode having one terminal connected to the other terminal of the magnetoresistive effect element, and the other terminal connected to the second interconnection, and configured to supply the first electric current in only one direction.

20 Claims, 12 Drawing Sheets

U.S. PATENT DOCUMENTS

2006/0220084 A1 * 10/2006 Umehara et al. ............ 257/296
2007/0047295 A1 3/2007 Cho et al.

FOREIGN PATENT DOCUMENTS

JP 2006-156840 6/2006

OTHER PUBLICATIONS

W.C. Jeong, et al., "Highly Scalable MRAM Using Field Assisted Current Induced Switching", Symposium on VLSI Technology Digest of Technical Papers, 10B-1, 2005, pp. 184-185.

* cited by examiner

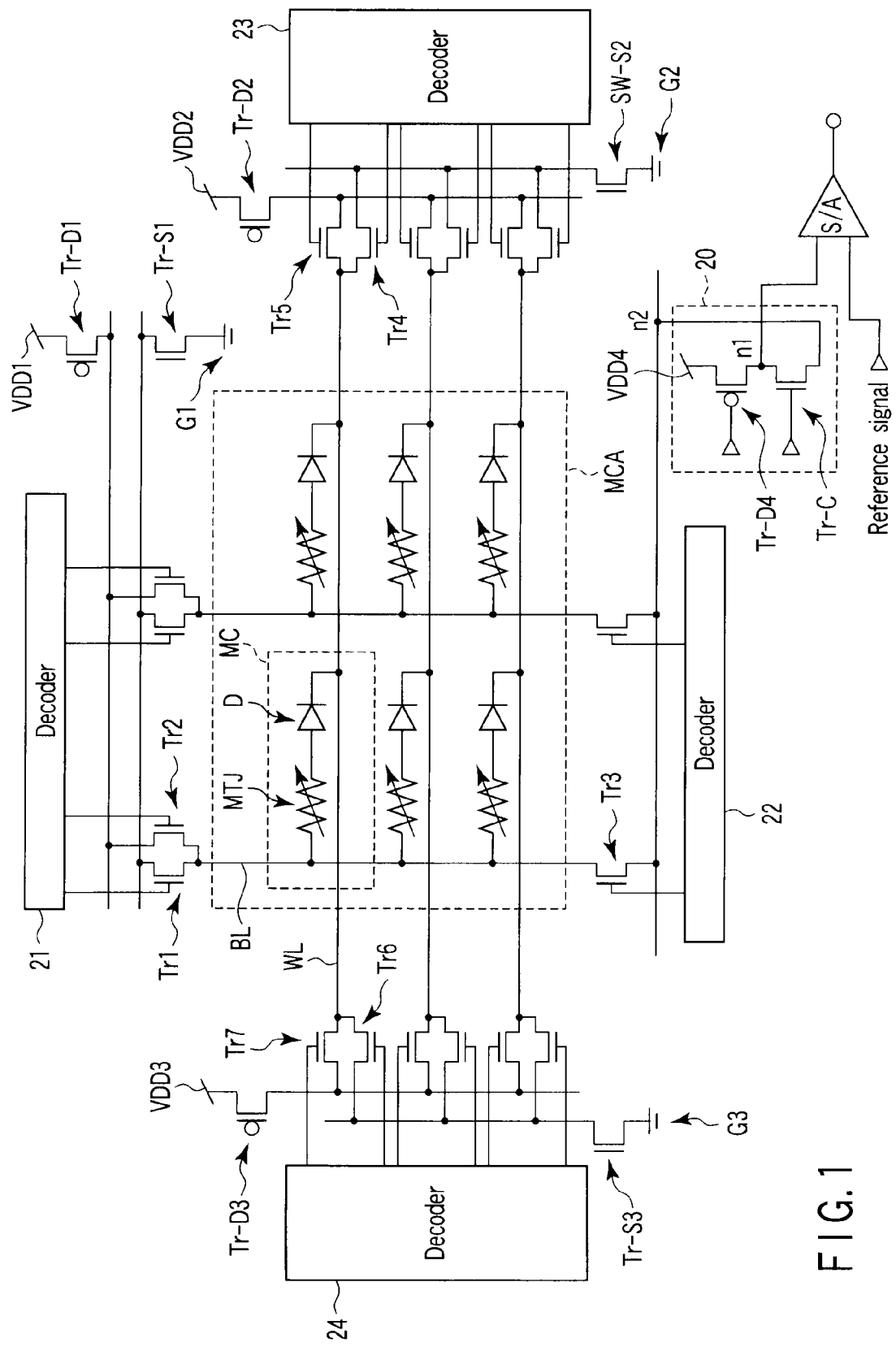
F I G. 1

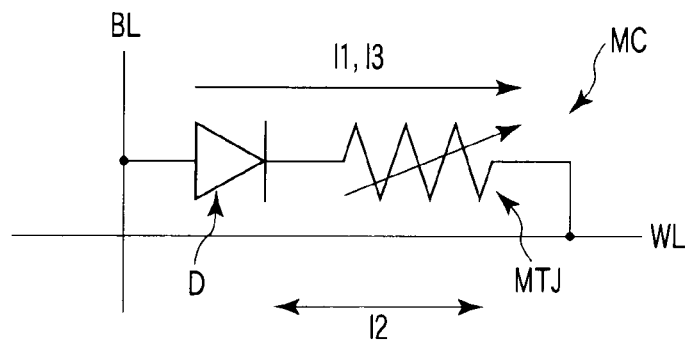
FIG. 2
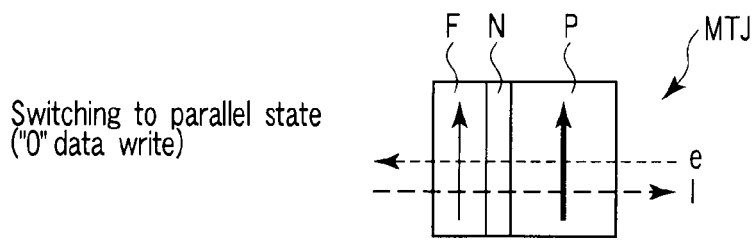
Switching to parallel state
("0" data write)
FIG. 3A
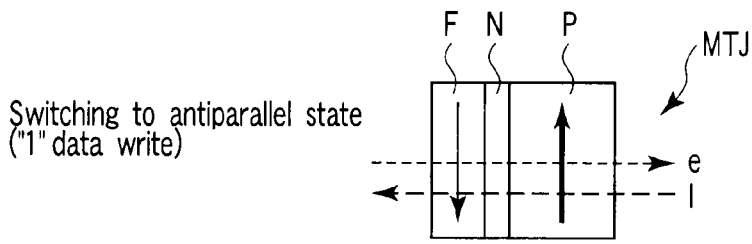
Switching to antiparallel state
("1" data write)
FIG. 3B
|  | Current value (mA) | | Current density (A/cm2) | |
| --- | --- | --- | --- | --- |
|  | Ic(+) | Ic(−) | Jc(+) | Jc(−) |
| Recording layer F | 1.15 | 0.33 | 1.6037E+07 | 4.5957E+06 |
| Fixed layer P | 38.49 | 11.03 | 4.8112E+07 | 1.3787E+07 |
FIG. 4

| Write of first data | Write of Second data |
|---|---|
| 1. Inject electrons between fixed layer P and recording layer F (spin injection write) | 1. Reverse magnetization in fixed layer P (field write)<br>2. Inject electrons between fixed layer P and recording layer F (spin injection write)<br>3. Reverse magnetization in fixed layer P (field write) |
FIG. 5
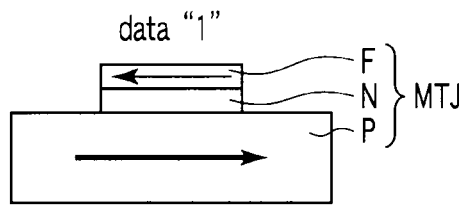
FIG. 6A
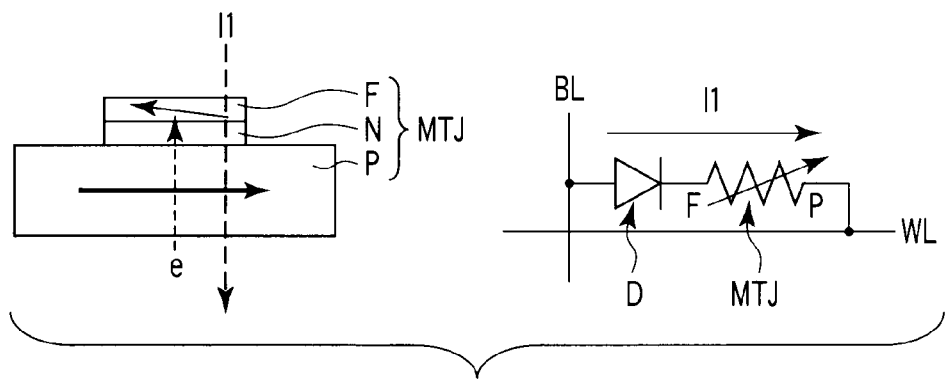
FIG. 6B
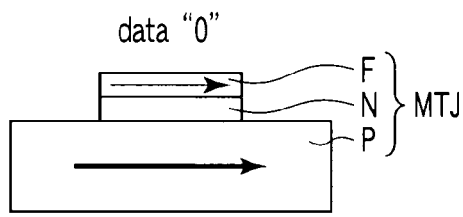
FIG. 6C

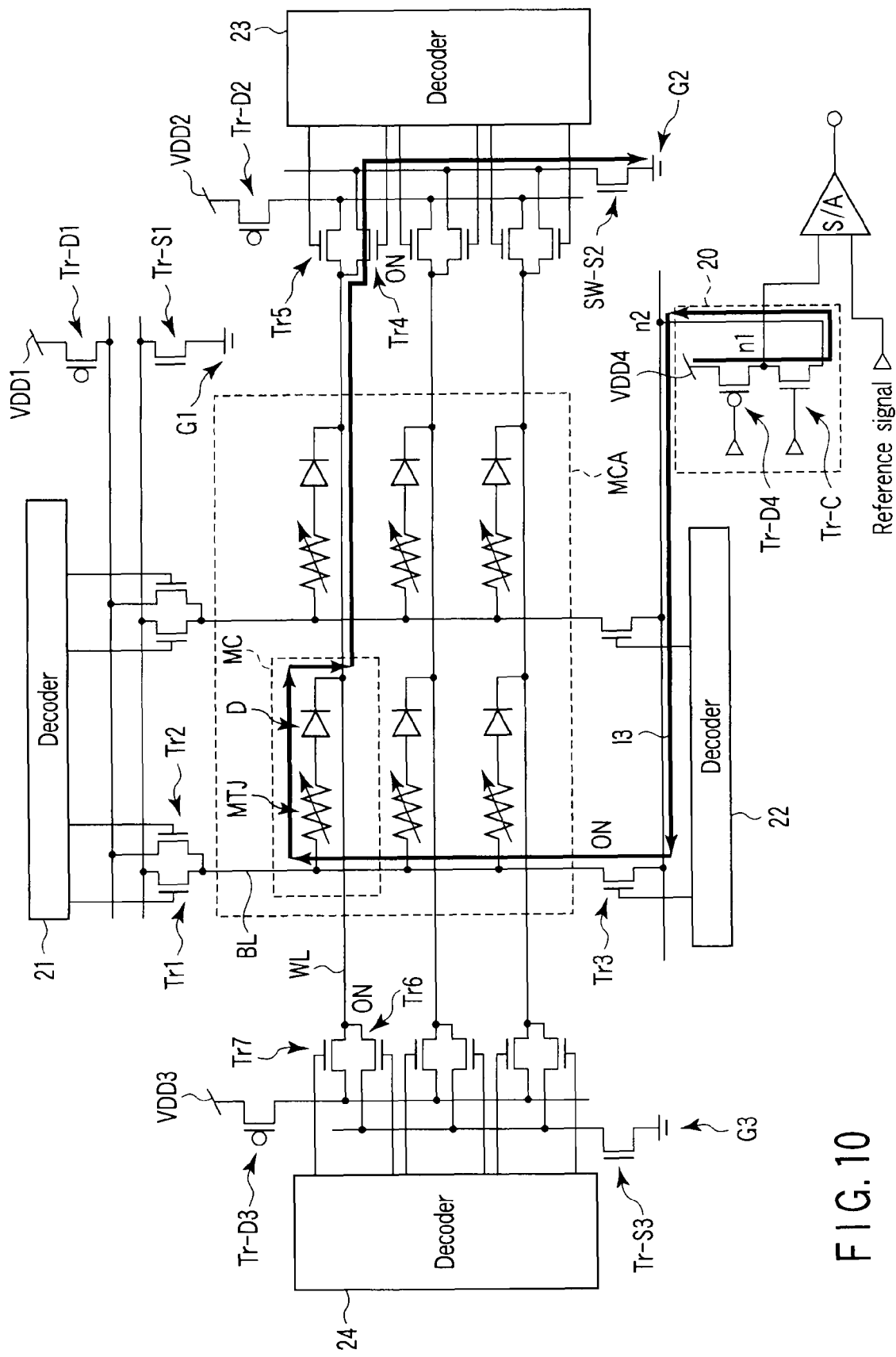
F I G. 10

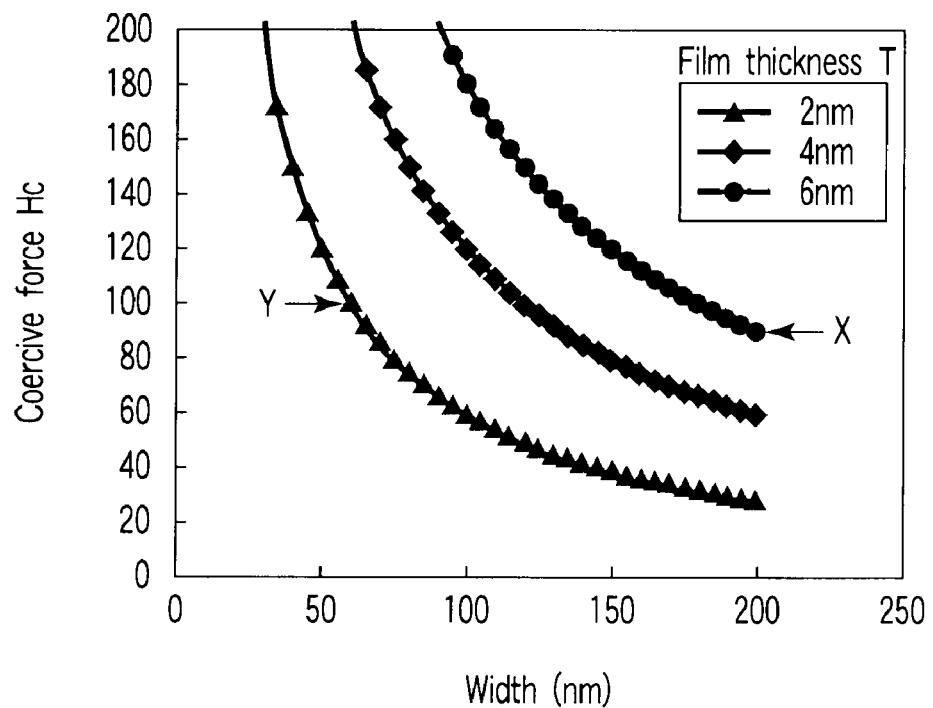
F I G. 11
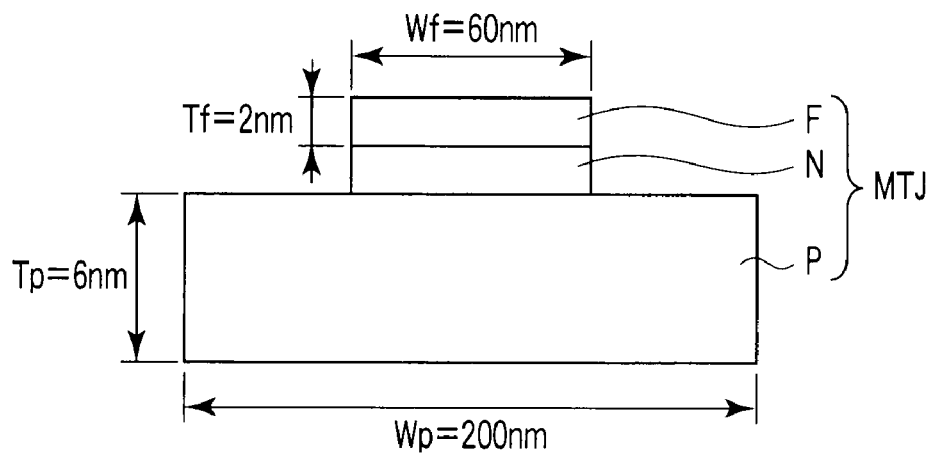
F I G. 12

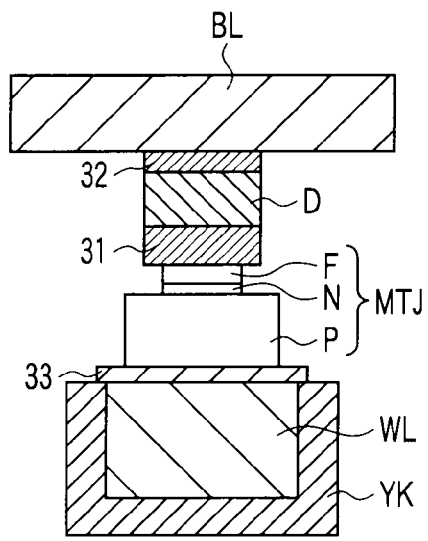 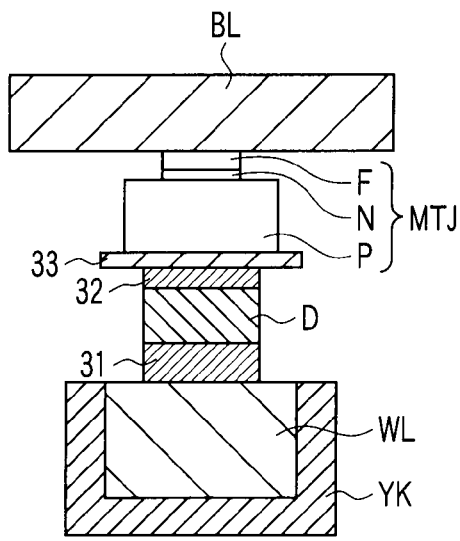
FIG. 13A  FIG. 13B
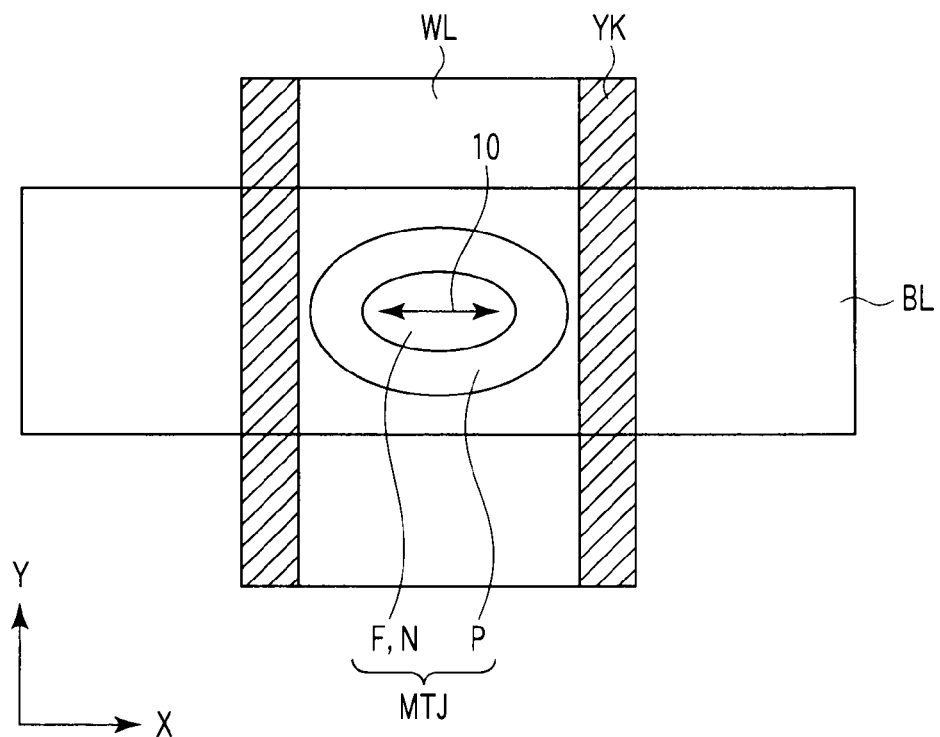
FIG. 14

MAGNETIC RANDOM ACCESS MEMORY AND WRITE METHOD OF THE SAME

CROSS-REFERENCE TO RELATED APPLICATIONS

This application is based upon and claims the benefit of priority from prior Japanese Patent Application No. 2007-027029, filed Feb. 6, 2007, the entire contents of which are incorporated herein by reference.

BACKGROUND OF THE INVENTION

1. Field of the Invention

The present invention relates to a spin injection magnetization reversal type magnetic random access memory and a write method of the same.

2. Description of the Related Art

A spin injection magnetization reversal type magnetic random access memory (MRAM) uses a 1 Tr+1 MTJ cell arrangement. In a spin injection write operation, whether to apply electrons from a recording layer to a fixed layer (spin filter layer) or vice verse is controlled in accordance with data to be written. That is, in this spin injection write method, electrons must be applied in two directions with respect to the film surface of an MTJ (Magnetic Tunnel Junction) element. Therefore, a transistor is used as a switching element of a cell because a one-way rectifying element such as a diode cannot be used. However, the cell integration degree when transistors are used is smaller than that when diodes are used.

Note that prior art reference information related to the present invention is as follows.

[Patent Reference 1] Jpn. Pat. Appln. KOKAI Publication No. 2006-156840

[Patent Reference 2] Jpn. Pat. Appln. KOKAI Publication No. 2006-128579

BRIEF SUMMARY OF THE INVENTION

A magnetic random access memory according to the first aspect of the present invention comprising a first interconnection extending to a first direction, a second interconnection extending to a second direction perpendicular to the first direction, a magnetoresistive effect element formed between the first interconnection and the second interconnection at an intersection of the first interconnection and the second interconnection, having one terminal connected to the first interconnection, comprising a fixed layer, a recording layer, and a nonmagnetic layer formed between the fixed layer and the recording layer, a film thickness of the fixed layer being larger than that of the recording layer, and a width of the fixed layer being larger than that of the recording layer, and configured to reverse a magnetization direction in the recording layer by supplying a first electric current between the fixed layer and the recording layer, and a diode having one terminal connected to the other terminal of the magnetoresistive effect element, and the other terminal connected to the second interconnection, and configured to supply the first electric current in only one direction.

A write method of a magnetic random access memory according to the second aspect of the present invention including a first interconnection extending to a first direction, second interconnection extending to a second direction perpendicular to the first direction, a magnetoresistive effect element formed between the first interconnection and the second interconnection at an intersection of the first interconnection and the second interconnection, having one terminal connected to the first interconnection, and comprising a fixed layer, a recording layer, and a nonmagnetic layer formed between the fixed layer and the recording layer, a film thickness of the fixed layer being larger than that of the recording layer, and a width of the fixed layer being larger than that of the recording layer, and a diode having one terminal connected to the other terminal of the magnetoresistive effect element, and the other terminal connected to the second interconnection, the method comprising in the case of writing first data in the magnetoresistive effect element, reversing magnetization in the recording layer by supplying a first electric current between the fixed layer and the recording layer, and in the case of writing second data in the magnetoresistive effect element, generating a first magnetic field by supplying a second electric current to one of the first interconnection and the second interconnection, and reversing only magnetization in the fixed layer by applying the first magnetic field to the fixed layer, reversing magnetization in the recording layer by supplying a third electric current between the fixed layer and the recording layer in the same direction as that of the first electric current, and generating a second magnetic field by supplying a fourth electric current to one of the first interconnection and the second interconnection in a direction opposite to that of the second electric current, and reversing only magnetization in the fixed layer by applying the second magnetic field to the fixed layer.

BRIEF DESCRIPTION OF THE SEVERAL VIEWS OF THE DRAWING

FIG. 1 is a schematic circuit diagram of a magnetic random access memory according to the first embodiment of the present invention;

FIG. 2 is a schematic view for explaining an outline of write and read operations according to the first embodiment of the present invention;

FIG. 3A is a view for explaining the principle of switching to a parallel state of spin injection magnetization reversal according to the first embodiment, and FIG. 3B is a view for explaining the principle of switching to an antiparallel state of spin injection magnetization reversal according to the first embodiment;

FIG. 4 is a view showing current values and current densities with which magnetization can reverse in spin injection magnetization reversal according to the first embodiment;

FIG. 5 is a view showing the write operation sequence of the magnetic random access memory according to the first embodiment of the present invention;

FIGS. 6A to 6C are views for explaining "0" write of write operation example 1 of the magnetic random access memory according to the first embodiment of the present invention;

FIG. 10 is a view for explaining the read operation of the magnetic random access memory according to the first embodiment of the present invention;

FIG. 11 is a graph showing the relationship between the width and coercive force of an MTJ element according to the first embodiment of the present invention when the film thickness of the MTJ element changes;

FIG. 12 is a sectional view of the MTJ element according to the first embodiment of the present invention;

FIGS. 13A and 13B are sectional views of a memory cell of the magnetic random access memory according to the first embodiment of the present invention;

FIG. 14 is a view showing the layout of the memory cell of the magnetic random access memory according to the first embodiment of the present invention;

DETAILED DESCRIPTION OF THE INVENTION

Figure 7A:
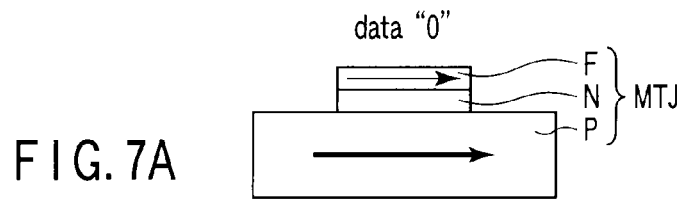
FIGS. 7A to 7E are views for explaining "1" write of write operation example 1 of the magnetic random access memory according to the first embodiment of the present invention.

Embodiments of the present invention will be explained below with reference to the accompanying drawing. In the following explanation, the same reference numerals denote the same parts throughout the drawing.

[1] First Embodiment

[1-1] Circuit Configuration

FIG. 1 is a schematic circuit diagram of a magnetic random access memory according to the first embodiment of the present invention. An outline of the circuit configuration of the magnetic random access memory according to the first embodiment will be explained below.

As shown in FIG. 1, a memory cell MC comprises an MTJ element MTJ and diode D. The MTJ element MTJ and diode D are connected in series by connecting one terminal of the MTJ element MTJ and one terminal of the diode D. The other terminal of the MTJ element MTJ is connected to a bit line BL. The other terminal of the diode D is connected to a word line WL.

At the end portion of a memory cell array MCA on the upper side of the drawing surface, the bit line BL is connected to a transistor Tr-S1 functioning as a sinker via a selection transistor Tr1. The transistor Tr-S1 is connected to a ground terminal G1. The bit line BL is also connected to a transistor Tr-D1 functioning as a spin injection write driver via a selection transistor Tr2. The transistor Tr-D1 is connected to a power supply terminal VDD1. A decoder 21 controls gate signals of the selection transistors Tr1 and Tr2.

At the end portion of the memory cell array MCA on the lower side of the drawing surface, the bit line BL is connected to a read circuit 20 via a selection transistor Tr3. The read circuit 20 is connected to a sense amplifier S/A. A decoder 22 controls a gate signal of the selection transistor Tr3.

At the end portion of the memory cell array MCA on the right side of the drawing surface, the word line WL is connected to a transistor Tr-S2 functioning as a sinker via a selection transistor Tr4. The transistor Tr-S2 is connected to a ground terminal G2. The word line WL is also connected to a transistor Tr-D2 functioning as a magnetic field write driver via a selection transistor Tr5. The transistor Tr-D2 is connected to a power supply terminal VDD2. A decoder 23 controls gate signals of the selection transistors Tr4 and Tr5.

At the end portion of the memory cell array MCA on the left side of the drawing surface, the word line WL is connected to a transistor Tr-S3 functioning as a sinker via a selection transistor Tr6. The transistor Tr-S3 is connected to a ground terminal G3. The word line WL is also connected to a transistor Tr-D3 functioning as a magnetic field write driver via a selection transistor Tr7. The transistor Tr-D3 is connected to a power supply terminal VDD3. A decoder 24 controls gate signals of the selection transistors Tr6 and Tr7.

The read circuit 20 comprises a transistor Tr-D4 functioning as a read driver, and a read voltage control transistor Tr-C. The current path of the transistor Tr-D4 has one end connected to a node n1, and the other end connected to a power supply terminal VDD4. The current path of the transistor Tr-C has one end connected to the node n1, and the other end connected to a node n2. The node n1 is connected to one input terminal of the sense amplifier S/A. A reference signal RS is input to the other input terminal of the sense amplifier S/A.

Note that in this embodiment, the driver that supplies a write current in one direction is connected to the bit line BL, and the driver that supplies a write current in two directions is connected to the word line WL. However, the present invention is not limited to this embodiment. For example, it is also possible to connect the driver that supplies a write current in two directions to the bit line BL, and the driver that supplies a write current in one direction to the word line WL. The driver that supplies a write current in two directions may also be connected to both the bit line BL and word line WL.

[1-2] Outline of Write and Read Operations

FIG. 2 is a schematic view for explaining an outline of write and read operations according to the first embodiment of the present invention. The outline of the write and read operations will be explained below.

As shown in FIG. 2, the write and read operations use a total of three different electric currents I1, I2, and I3. More specifically, in the write operation, the write current I1 flows through the MTJ element MTJ and diode D, or the write current I2 flows through the word line WL. In the read operation, the read current I3 flows through the MTJ element MTJ and diode D.

The write current I1 is a spin injection electric current for reversing magnetization in a recording layer of the MTJ element MTJ. The write current I2 is a magnetic field write electric current for reversing magnetization in a fixed layer of the MTJ element MTJ.

The write operation uses the two electric currents I1 and I2 as described above for the following reason. In this embodiment, the diode D through which an electric current flows in only one direction is connected to the MTJ element MTJ. Therefore, the spin injection write current I1 is supplied in one direction by controlling the magnetization direction in the fixed layer by using a magnetic field generated by the write current I2. Details of this write operation will be described later.

The current values of the three electric currents I1, I2, and I3 have a relationship indicated by $$I3 < I1 < I2 \tag{1}$$

That is, the current value of the write current I1 for spin injection is larger than that of the read current I3, and the current value of the write current I2 for magnetic field write is larger than that of the write current I1 for spin injection. This relationship makes it possible to reduce the possibility of disturbance, and improve the reliability.

[1-3] Write Operation (Principle of Spin Injection Magnetization Reversal)

FIGS. 3A and 3B are views for explaining the principle of spin injection magnetization reversal according to the first embodiment. FIG. 4 shows current values and current densities with which magnetization can reverse in spin injection magnetization reversal according to the first embodiment. The principle of spin injection magnetization reversal will be explained below.

As shown in FIGS. 3A and 3B, the MTJ element MTJ has a fixed layer (pinned layer) P functioning as a sin filter, a recording layer (free layer) F, and a nonmagnetic layer N sandwiched between the fixed layer P and recording layer F.

When data write using spin injection magnetization reversal is performed in the MTJ element MTJ as described above, the magnetization directions in the fixed layer P and recording layer F take a parallel state or antiparallel state in accordance with the direction of an electric current I flowing between the fixed layer P and recording layer F. Details are as follows.

First, when switching the antiparallel state to the parallel state as shown in FIG. 3A, the electric current I is supplied from the recording layer F to the fixed layer P of the MTJ element MTJ. That is, electrons e are injected from the fixed layer P into the recording layer F. Consequently, the magnetization directions in the fixed layer P and recording layer F become equal and parallel. A low-resistance state Rp like this is defined as, e.g., data "0".

On the other hand, when switching the parallel state to the antiparallel state as shown in FIG. 3B, the electric current I is supplied from the fixed layer P to the recording layer F of the MTJ element MTJ. That is, the electrons e are injected from the recording layer F into the fixed layer P. Consequently, the magnetization directions in the fixed layer P and recording layer F become opposite and antiparallel. A high-resistance state Rap like this is defined as, e.g., data "1".

The write currents necessary for switching as described above are represented by $$Ic^{P \to AP} = -e(VMs/\mu_B)\alpha\gamma[Hext+Hani+Ms/2]/g(0) \quad (2)$$

$$Ic^{AP \to P} = -e(VMs/\mu_B)\alpha\gamma[Hext-Hani-Ms/2]/g(\pi) \quad (3)$$

where $Ic^{P \to AP}$ is a critical current when the parallel state changes to the antiparallel state, $Ic^{AP \to P}$ is a critical current when the antiparallel state changes to the parallel state, V is the volume of the recording layer F, Ms is the saturation magnetization of the recording layer F, $\mu_B$ is the Bohr magneton, $\alpha$ is the Gilberd's damping coefficient, $\gamma$ is the magnetic gyro coefficient ($\gamma<0$) of the recording layer F, Hext is an externally applied magnetic field, Hani is the uniaxial anisotropic magnetic field of the recording layer F, Ms is a demagnetizing field in the film thickness direction, and $g(\theta)$ is the efficiency.

For example, FIG. 4 shows current values Ic (mA) and current densities Jc (A/cm$^2$) with which magnetization in each of the recording layer F and fixed layer P reverses when the recording layer F has a film thickness of 2 nm and a width of 60 nm and the fixed layer P has a film thickness of 6 nm and a width of 200 nm. As shown in FIG. 4, the current value Ic for reversing magnetization in the fixed layer P is much higher than the current value Ic for reversing magnetization in the recording layer F. That is, even when an electric current of about a few mA is supplied during spin injection write, only magnetization in the recording layer F can be reversed without reversing magnetization in the fixed layer P.

The use of the spin injection magnetization reversing technique as described above eliminates the problem of disturbance in a semi-selected state when data write is performed using a biaxial current magnetic field. This makes selective data write feasible.

(Write Operation Sequence)

FIG. 5 shows the write operation sequence of the magnetic random access memory according to the first embodiment of the present invention. The write operation sequence according to the first embodiment will be explained below.

As shown in FIG. 5, write operations of writing first data and second data are different. Note that the first data is data "0" or "1", and the second data is data "1" or "0".

The operation of writing the first data has only a step of performing spin injection write. More specifically, magnetization in the recording layer F of a selected cell is reversed by supplying the write current I1 (injecting electrons) between the fixed layer P and recording layer F of the selected cell.

The operation of writing the second data has a first step of performing magnetic field write, a second step of performing spin injection write, and a third step of performing magnetic field write again. More specifically, in the first step, a magnetic field is generated by supplying the write current I2 to the word line WL of a selected cell. This magnetic field is applied to the fixed layer P of the selected cell, thereby reversing only magnetization in the fixed layer P. In the second step, the write current I1 is supplied (electrons are injected) between the fixed layer P and recording layer F of the selected cell, thereby reversing magnetization in the recording layer F of the selected cell. In the third step, a magnetic field is generated by supplying the write current I2 to the word line WL of the selected cell. This magnetic field is applied to the fixed layer P of the selected cell, thereby reversing only magnetization in the fixed layer P. In the first and third steps, the magnetic fields are applied to the fixed layer P in opposite directions by supplying the write current I2 in opposite directions.

Practical write operation examples will be explained below on the basis of the write operation sequence as described above.

Write Operation Example 1

In write operation example 1, the diode D is connected to the MTJ element MTJ such that an electric current flows in one direction from the recording layer F to the fixed layer P.

FIGS. 6A to 6C are views for explaining "0" write of write operation example 1 of the magnetic random access memory according to the first embodiment of the present invention. FIGS. 7A to 7E are views for explaining "1" write of write operation example 1 of the magnetic random access memory according to the first embodiment of the present invention. The "0" and "1" write sequences of write operation example 1 will be explained below. Note that magnetization in the fixed layer P is set rightward in the initial state.

Data "0" is written in the memory cell MC as follows. In the initial state as shown in FIG. 6A, magnetization in the fixed layer P is rightward, and that in the recording layer F is leftward, so the magnetization directions in the two layers are in the antiparallel state ("1" state). As shown in FIG. 6B, the write current I1 is supplied from the recording layer F to the fixed layer P of the MTJ element MTJ in this magnetization state. That is, the electrons e are supplied from the fixed layer P to the recording layer F. Consequently, as shown in FIG. 6C, magnetization in the recording layer F reverses rightward by the spin injection magnetization reversing technique. Accordingly, the magnetization directions in the fixed layer P and recording layer F become parallel, and data "0" is written in the MTJ element MTJ.

Figure 7B:
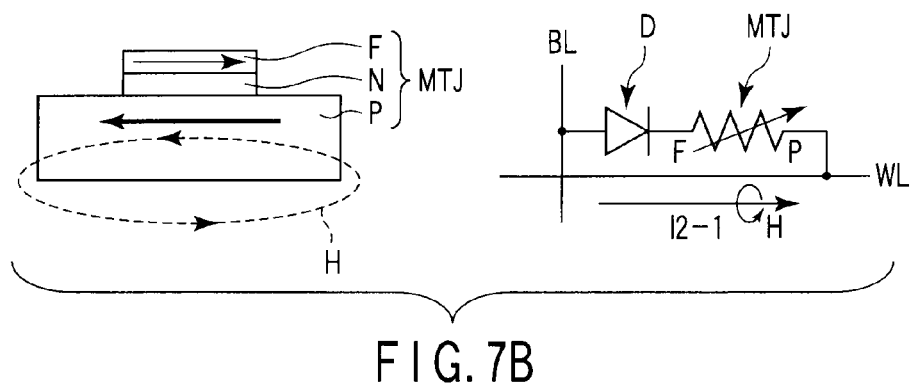
Figure 7C:
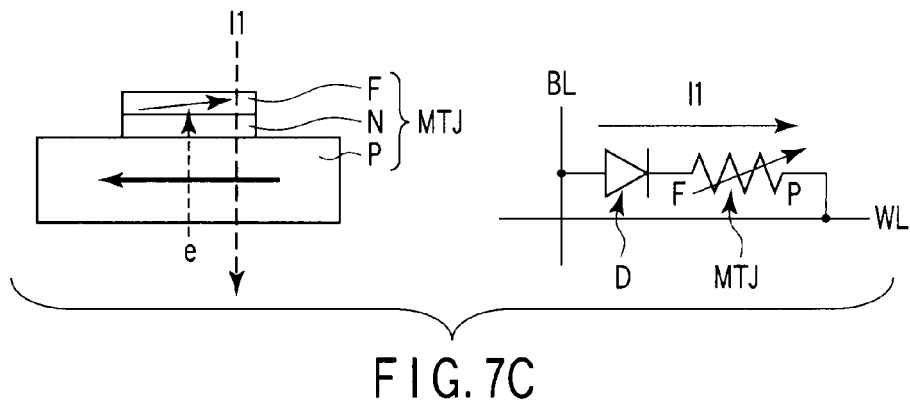
Figure 7D:
Figure 7E:
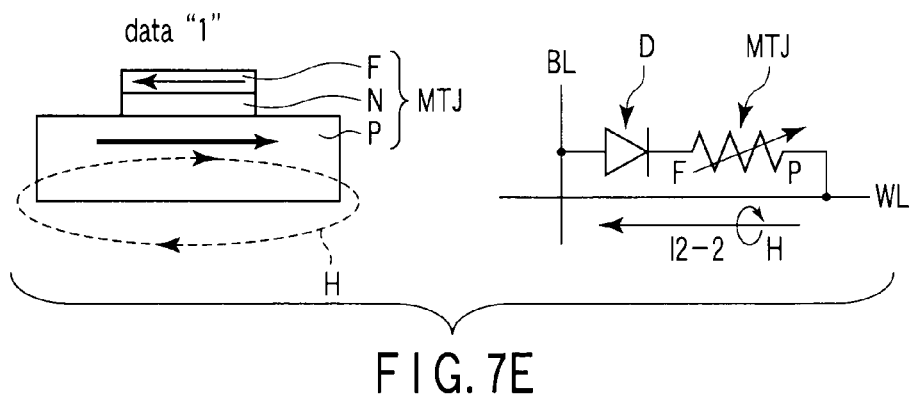

Data "1" is written in the memory cell MC as follows. In the initial state as shown in FIG. 7A, magnetization in the fixed layer P is rightward, and that in the recording layer F is rightward, so the magnetization directions in the two layers are in the parallel state ("0" state). As shown in FIG. 7B, a write current I2-1 is supplied to the MTJ element MTJ in this magnetization state in the first direction (rightward in the drawing surface) of the word line WL. As a consequence, a counterclockwise magnetic field H generated by the write current I2-1 reverses only magnetization in the fixed layer P leftward. This makes the magnetization directions in the MTJ element MTJ antiparallel. Then, as shown in FIG. 7C, the write current I1 is supplied from the recording layer F to the fixed layer P. That is, the electrons e are supplied from the fixed layer P to the recording layer F. Consequently, as shown in FIG. 7D, magnetization in the recording layer F reverses leftward by the spin injection magnetization reversing technique. This makes the magnetization directions in the MTJ element MTJ parallel. Finally, as shown in FIG. 7E, a write current I2-2 is supplied in the second direction (leftward in the drawing surface) of the word line WL. As a result, a clockwise magnetic field H generated by the write current I2-2 reverses only magnetization in the fixed layer P rightward. Accordingly, the magnetization directions in the fixed layer P and recording layer F become antiparallel, and data "1" is written in the MTJ element MTJ.

As described above, the write sequence of write operation example 1 changes in accordance with whether data to be written is data "0" or "1". Regardless of whether to write data "0" or "1", however, the write current I1 need only be supplied in one direction from the recording layer F to the fixed layer P when performing spin injection write.

Write Operation Example 2

Write operation example 2 differs from write operation example 1 in the direction of en electric current flowing through the MTJ element MTJ. That is, in write operation example 2, the diode D is connected to the MTJ element MTJ such that an electric current flows in one direction from fixed layer P to the recording layer F.

Figure 8A:
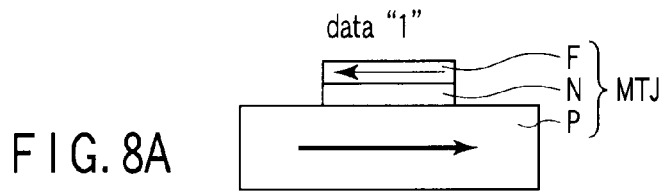
FIGS. 8A to 8E are views for explaining "0" write of write operation example 2 of the magnetic random access memory according to the first embodiment of the present invention.
Figure 8B:
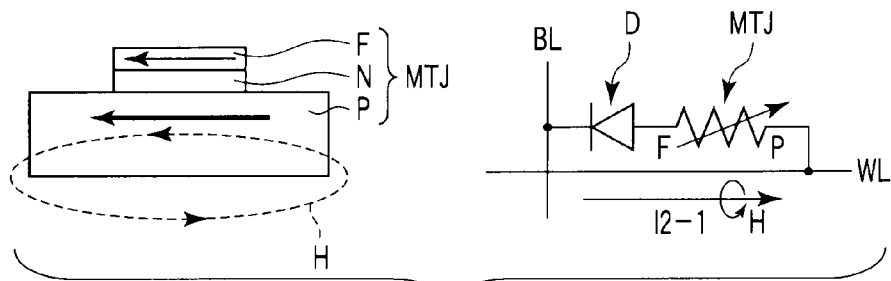
Figure 8C:
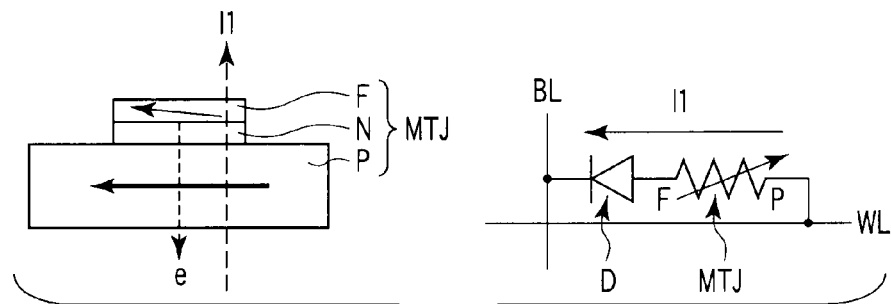
Figure 8D:
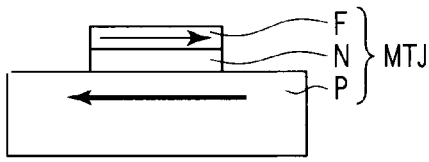
Figure 8E:
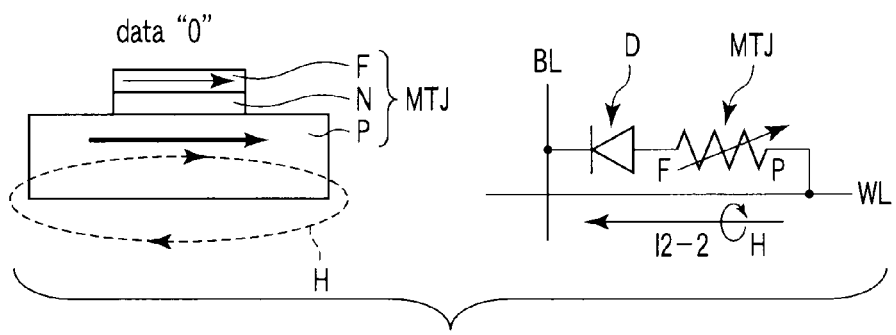
Figure 9A:
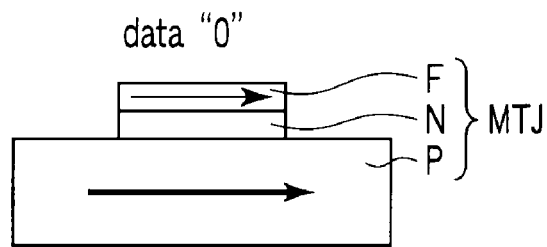
FIGS. 9A to 9C are views for explaining "1" write of write operation example 2 of the magnetic random access memory according to the first embodiment of the present invention.
Figure 9B:
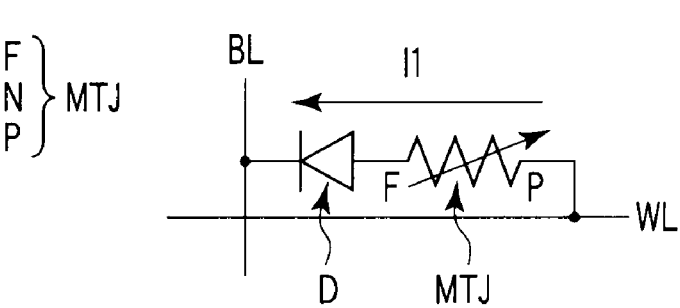
Figure 9C:
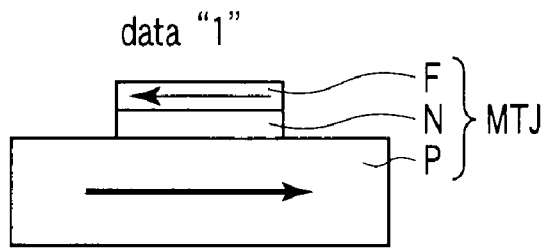

FIGS. 8A to 8E are views for explaining "0" write of write operation example 2 of the magnetic random access memory according to the first embodiment of the present invention. FIGS. 9A to 9C are views for explaining "1" write of write operation example 2 of the magnetic random access memory according to the first embodiment of the present invention. The "0" and "1" write sequences of write operation example 2 will be explained below. Note that magnetization in the fixed layer P is set rightward in the initial state.

Data "0" is written in the memory cell MC as follows. In the initial state as shown in FIG. 8A, magnetization in the fixed layer P is rightward, and that in the recording layer F is leftward, so the magnetization directions in the two layers are in the antiparallel state ("1" state). As shown in FIG. 8B, the write current I2-1 is supplied to the MTJ element MTJ in this magnetization state in the first direction (rightward in the drawing surface) of the word line WL. As a consequence, a counterclockwise magnetic field H generated by the write current I2-1 reverses only magnetization in the fixed layer P leftward. This makes the magnetization directions in the MTJ element MTJ parallel. Then, as shown in FIG. 8C, the write current I1 is supplied from the fixed layer P to the recording layer F. That is, the electrons e are supplied from the recording layer F to the fixed layer P. Consequently, as shown in FIG. 8D, magnetization in the recording layer F reverses rightward by the spin injection magnetization reversing technique. This makes the magnetization directions in the MTJ element MTJ antiparallel. Finally, as shown in FIG. 8E, the write current I2-2 is supplied in the second direction (leftward in the drawing surface) of the word line WL. As a result, a clockwise magnetic field H generated by the write current I2-2 reverses only magnetization in the fixed layer P rightward. Accordingly, the magnetization directions in the fixed layer P and recording layer F become parallel, and data "0" is written in the MTJ element MTJ.

Data "1" is written in the memory cell MC as follows. In the initial state as shown in FIG. 9A, magnetization in the fixed layer P is rightward, and that in the recording layer F is rightward, so the magnetization directions in the two layers are in the parallel state ("0" state). As shown in FIG. 9B, the write current I1 is supplied from the fixed layer P to the recording layer F of the MTJ element MTJ in this magnetization state. That is, the electrons e are supplied from the recording layer F to the fixed layer P. Consequently, as shown in FIG. 9C, magnetization in the recording layer F reverses leftward by the spin injection magnetization reversing technique. Accordingly, the magnetization directions in the fixed layer P and recording layer F become antiparallel, and data "1" is written in the MTJ element MTJ.

As described above, the write sequence of write operation example 2 changes in accordance with whether data to be written is data "0" or "1". Regardless of whether to write data "0" or "1", however, the write current I1 need only be supplied in one direction from the fixed layer P to the recording layer F when performing spin injection write.

In write operation example 1, the diode D is connected such that an electric current flows in one direction from the recording layer F to the fixed layer P. In write operation example 2, however, the diode D is connected such that an electric current flows in one direction from the fixed layer P to the recording layer F. In write operation example 1, therefore, the first data write sequence shown in FIG. 5 is used when writing data "0", and the second data write sequence shown in FIG. 5 is used when writing data "1". By contrast, in write operation example 2, the second data write sequence shown in FIG. 5 is used when writing data "0", and the first data write sequence shown in FIG. 5 is used when writing data "1". Accordingly, the "0" and "1" write sequences in write operation example 2 are opposite to those in write operation example 1.

Note that the write current I2 for magnetic field write is supplied to the word line WL in write operation examples 1 and 2, but the write current I2 may also be supplied to the bit line BL.

[1-4] Read Operation

FIG. 10 is a view for explaining the read operation of the magnetic random access memory according to the first embodiment of the present invention. The read operation using the magnetoresistive effect according to the first embodiment will be explained below.

First, the read current I3 flows from the power supply terminal VDD4 to the MTJ element MTJ of a selected cell MC via the transistors Tr-D4, Tr-C, and Tr3 and the bit line BL. The read current I3 flows to the ground terminal G2 via the diode D, the word line WL, the transistor Tr4, and a transistor SW-S2.

The sense amplifier S/A discriminates between data "1" and "0" by comparing a signal read out from the cell with the reference signal RS.

Note that the read operation can be performed by reading out a current value by applying a constant voltage, or reading out a voltage value by supplying a constant current.

[1-5] MTJ Element (Film Thickness and Width)

FIG. 11 shows the relationship between the width and coercive force of the MTJ element according to the first embodiment of the present invention when the film thickness of the MTJ element changes. In this simulation shown in FIG. 11, the demagnetizing field coefficient C(k) was set at 0.3, and the saturation magnetization Ms was set at 800. FIG. 12 is a sectional view of the MTJ element according to the first embodiment of the present invention. The MTJ element will be explained below.

Generally, the relationship between the coercive force Hc and the volume of the MTJ element is indicated by $$Hc = 4\pi \times C(k) \times Ms \times T/W \quad (4)$$

where T is the thickness, W is the width, C(k) is the demagnetizing field coefficient, and Ms is the saturation magnetization.

As shown in FIG. 11, as the width W of the magnetic layer of the MTJ element increases, the coercive force Hc decreases, and the switching magnetic field decreases. On the other hand, when the width W of the magnetic layer of the MTJ element is held constant, the coercive force Hc and switching magnetic field increase as the film thickness T of the magnetic layer increases.

In spin injection write of the write operation of this embodiment, only magnetization in the recording layer F is reversed without reversing magnetization in the fixed layer P. On the other hand, in magnetic field write, only magnetization in the fixed layer P must be reversed without reversing magnetization in the recording layer F. Accordingly, the fixed layer P desirably has the characteristics that magnetization does not reverse in spin injection write and readily reverses in magnetic field write.

To meet these two requirements, as shown in FIG. 12, the fixed layer P desirably has a film thickness Tp larger than a film thickness Tf of the recording layer F, and a width Wp larger than a width Wf of the recording layer F. That is, magnetization reversal in the fixed layer P is prevented during spin injection write by making the film thickness Tp of the fixed layer P larger than the film thickness Tf of the recording layer F. On the other hand, the coercive force Hc of the fixed layer P is weakened by making the width Wp of the fixed layer P larger than the width Wf of the recording layer F, thereby facilitating magnetization reversal in the fixed layer P during magnetic field write.

More specifically, the film thickness Tp and width Wp of the fixed layer P are respectively 6 and 200 nm (a plot X in FIG. 11), and the film thickness Tf and width Wf of the recording layer F are respectively 2 and 60 nm (a plot Y in FIG. 11). In this example, the Tp/Wp of the fixed layer P is lower than the Tf/Wf of the recording layer F. As can be seen from equation (4), therefore, the coercive force Hc (about 90) of the fixed layer P is smaller than the coercive force Hc (about 100) of the recording layer F.

In this embodiment as described above, the MTJ element MTJ is made such that the film thickness Tp of the fixed layer P is larger than the film thickness Tf of the recording layer F, and the width Wp of the fixed layer P is larger than the width Wf of the recording layer F. Also, the drivers are set such that the electric current I1 having a value with which only magnetization in the recording layer F reverses is supplied during spin injection write of the above-mentioned write operation, and the electric current I2 having a value with which only magnetization in the fixed layer P reverses is supplied during magnetic field write of the write operation.

Note that the width W of each of the fixed layer P and recording layer F means the length in the direction of the hard magnetization axis.

(Materials)

The fixed layer P and recording layer F are made of a ferromagnetic material. For example, it is favorable to use a film containing one of Fe, Co, and Ni, or an alloy film (e.g., CoFe or NiFe) containing at least one of Fe, Co, and Ni.

When the nonmagnetic layer N is made of a conductive material (e.g., a metal such as Cu or Pt), the magnetoresistive element has the GMR (Giant Magneto Resistive) effect. When the nonmagnetic layer N is made of an insulating material (e.g., MgO or $Al_2O_3$), the magnetoresistive element has the tunneling magnetoresistive effect.

(Others)

The MTJ element MTJ can be a parallel magnetization type element in which the magnetization stabilizing directions in the fixed layer P and recording layer F are parallel to the film surface, or a perpendicular magnetization type element in which the magnetization stabilizing directions in the fixed layer P and recording layer F are perpendicular to the film surface. In this embodiment, the parallel magnetization type MTJ element MTJ is desirable because magnetization in the fixed layer P readily reverses in magnetic field write.

Each of the fixed layer P and recording layer F is not limited to a single layer as shown in FIG. 12. For example, each of the fixed layer P and recording layer F may also be a layered film including a plurality of ferromagnetic layers. At least one of the fixed layer P and recording layer F may also have an antiferromagnetic coupling structure which includes three layers, i.e., a first ferromagnetic layer/a nonmagnetic layer/a second ferromagnetic layer, and in which the first and second ferromagnetic layers magnetically couple with each other (by interlayer exchange coupling) such that the magnetization directions in these layers are antiparallel, or a ferromagnetic coupling structure in which the first and second ferromagnetic layers magnetically couple with each other (by interlayer exchange coupling) such that the magnetization directions in these layers are parallel.

The MTJ element MTJ is not limited to a single-junction structure including one nonmagnetic layer as shown in FIG. 12, and may also have a double-junction structure including two nonmagnetic layers. An MTJ element MTJ having this double-junction structure comprises a first fixed layer, a second fixed layer, a recording layer formed between the first and second fixed layers, a first nonmagnetic layer formed between the first fixed layer and recording layer, and a second nonmagnetic layer formed between the second fixed layer and recording layer.

The planar shape of the MTJ element MTJ can be variously changed. Examples are a rectangle, ellipse, circle, hexagon, rhombus, parallelogram, cross, and bean (recessed shape).

[1-6] Memory Cell (Sectional Structures)

FIGS. 13A and 13B are sectional views of the memory cell of the magnetic random access memory according to the first embodiment of the present invention. The sectional structures of the memory cell of the magnetic random access memory according to the first embodiment will be explained below.

As shown in FIGS. 13A and 13B, the MTJ element MTJ and diode D are stacked between the bit line BL and word line WL at the intersection of the bit line BL and word line WL.

In the structure shown in FIG. 13A, the diode D is positioned between the MTJ element MTJ and bit line BL. That is, the diode D is formed on a conductive layer 31 on the recording layer F, and the bit line BL is formed on a conductive layer 32 on the diode D. The word line WL is formed below a conductive layer 33 below the fixed layer P.

In the structure shown in FIG. 13B, the diode D is positioned between the MTJ element MTJ and word line WL. That is, the diode D is formed below conductive layers 33 and 32 below the fixed layer P. The word line WL is formed below a conductive layer 31 below the diode D. The bit line BL is formed on the recording layer F.

In the structures shown in FIGS. 13A and 13B, a yoke layer YK may also be formed to cover the surfaces of the word line WL except for the surface opposing the MTJ element MTJ, i.e., the side surfaces and bottom surface of the word line WL in FIGS. 13A and 13B. The yoke layer YK is made of such a magnetic material as used in the fixed layer P and recording layer F. The yoke layer YK need only be formed on at least one surface of the word line WL except for the surface opposing the MTJ element MTJ. The yoke layer YK makes it possible to efficiently apply the magnetic field H of the write current I2 to the MTJ element MTJ.

To efficiently apply the magnetic field generated by the write current I2 flowing through the word line WL to the fixed layer P, the fixed layer P is desirably positioned closer to the word line WL than the recording layer F.

Note that the electric current I2 for generating the magnetic field for reversing magnetization in the fixed layer P is supplied to the word line WL in this embodiment, but the present invention is not limited to this embodiment. For example, the electric current I2 for magnetic field write may also be supplied to the bit line BL. In this case, a so-called top-pin structure in which the fixed layer P is positioned closer to the bit line BL than the recording layer F is favorable. Also, the yoke layer YK is preferably formed on at least one surface of the bit line BL except for the surface opposing the MTJ element MTJ.

(Layout)

FIG. 14 is a view showing the layout of the memory cell of the magnetic random access memory according to the first embodiment of the present invention. The layout of the memory cell of the magnetic random access memory according to the first embodiment will be explained below.

As shown in FIG. 14, the bit line BL extends to the X direction, and the word line WL extends to the Y direction (perpendicular to the X direction). The MTJ element MTJ is formed at the intersection of the bit line BL and word line WL. The direction of an easy magnetization axis 10 of the fixed layer P of the MTJ element MTJ is the same as the direction (X direction) in which the bit line BL extends, i.e., perpendicular to the direction (Y direction) in which the word line WL extends.

The planar shape of the MTJ element MTJ is, e.g., an ellipse. The area of the planar shape of the fixed layer P is desirably larger than that of the planar shape of the recording layer F. The planar shape of the nonmagnetic layer N is the same as that of the fixed layer P in this example, but may also be the same as that of the recording layer F.

[1-7] Effect

In the first embodiment described above, electrons for spin injection write need only be applied in one direction during the spin injection write operation by controlling the magnetization direction in the fixed layer P by the current magnetic field. Therefore, the diode D can be used as a switching element of the MTJ element MTJ. Consequently, a highly integrated magnetic random access memory can be implemented by placing the series-connected, stacked MTJ element MTJ and diode D between the bit line BL and word line WL.

[2] Second Embodiment

The second embodiment is an example in which memory cells of the first embodiment are layered on a substrate since an MTJ element MTJ and diode D can be stacked.

[2-1] Sectional Structure of Memory Cell

Figure 15:
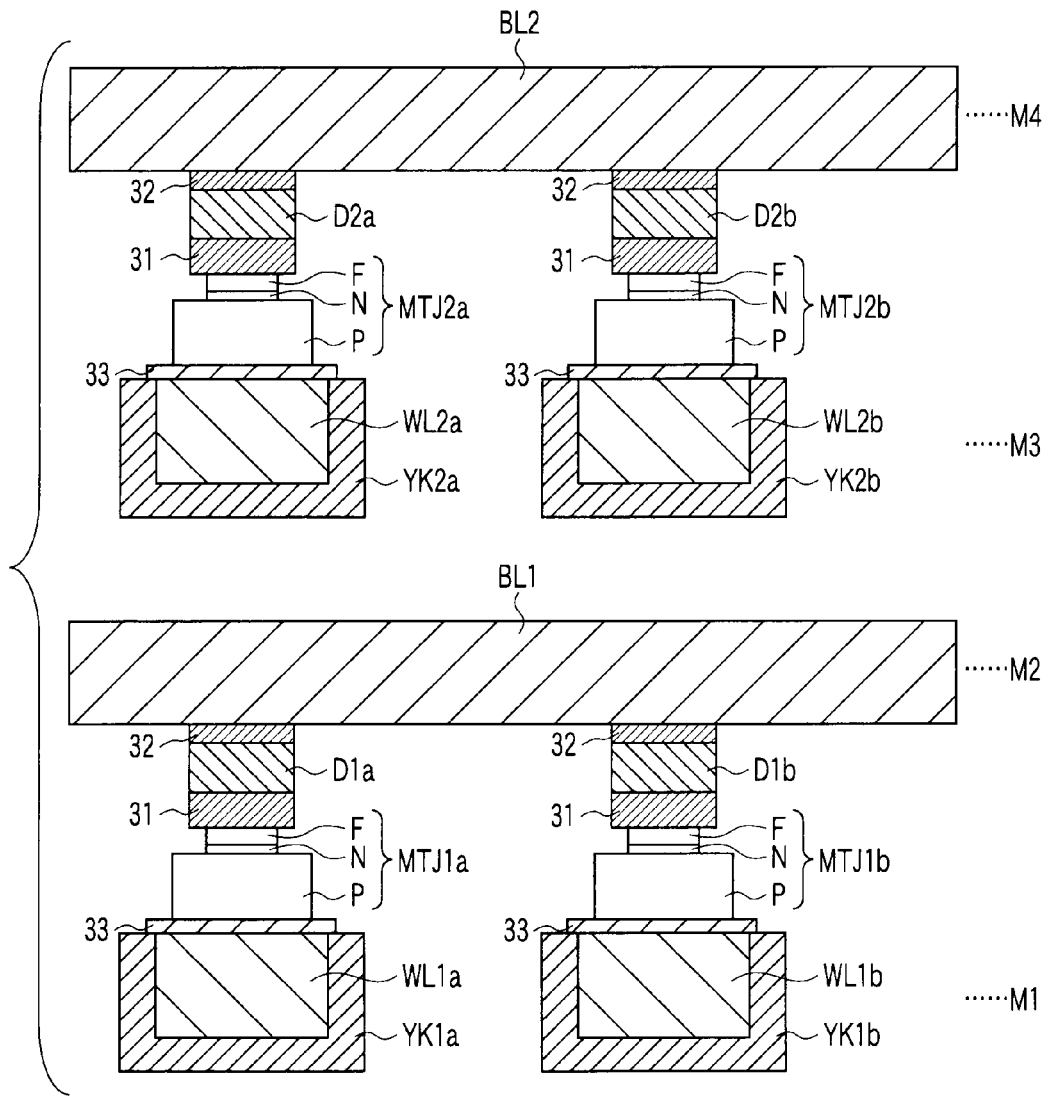
FIG. 15 is a sectional view of a memory cell of a magnetic random access memory according to the second embodiment of the present invention.

FIG. 15 is a sectional view of a memory cell of a magnetic random access memory according to the second embodiment of the present invention. The sectional structure of the memory cell of the magnetic random access memory according to the second embodiment will be explained below.

In the second embodiment as shown in FIG. 15, memory cells of the first embodiment are vertically stacked on a substrate (not shown).

More specifically, word lines WL1a and WL1b are formed in a first metal layer M1, and a bit line BL1 is formed in a second metal layer M2. An MTJ element MTJ1a and diode D1a are formed between the bit line BL1 and word line WL1a, and an MTJ element MTJ1b and diode D1b are formed between the bit line BL1 and word line WL1b.

Word lines WL2a and WL2b are formed in a third metal layer M3, and a bit line BL2 is formed in a fourth metal layer M4. An MTJ element MTJ2a and diode D2a are formed between the bit line BL2 and word line WL2a, and an MTJ element MTJ2b and diode D2b are formed between the bit line BL2 and word line WL2b.

Even in this embodiment as described above, the write and read operations are the same as in the first embodiment.

Note that although two memory cells are stacked in FIG. 15, three or more memory cells may also be stacked.

[2-2] Effects

The second embodiment described above can achieve the same effect as in the first embodiment. In addition, the second embodiment can further increase the degree of integration because the memory cells are layered.

[3] Third Embodiment

The third embodiment is an example in which an MTJ element MTJ is inclined to a direction in which a word line WL extends.

[3-1] Layout of Memory Cell

Figure 16:
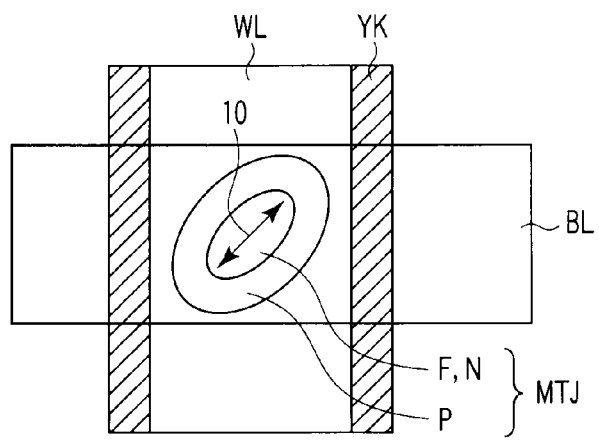
FIG. 16 is a plan view of a memory cell of a magnetic random access memory according to the third embodiment of the present invention.
Figure 17:
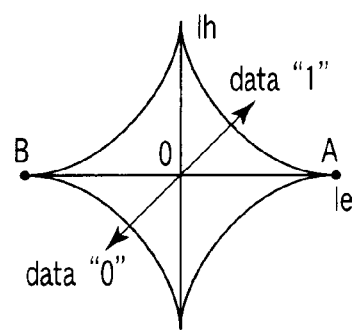
FIG. 17 is a graph showing the asteroid curves of an MTJ element according to the third embodiment of the present invention.

FIG. 16 is a plan view of a memory cell of a magnetic random access memory according to the third embodiment of the present invention. FIG. 17 shows the asteroid curves of an MTJ element according to the third embodiment of the present invention. The layout of the memory cell of the magnetic random access memory according to the third embodiment will be explained below.

In the first and second embodiments described above, the direction of an easy magnetization axis 10 of the MTJ element MTJ is perpendicular to the direction (Y direction) in which the word line WL extends. Also, a uniaxial current magnetic field H generated by a write current I2 flowing through the word line WL reverses magnetization in a fixed layer P. This requires a current value outside points A and B in FIG. 17, and increases the write current I2 in the case of uniaxial write.

In the third embodiment, therefore, as shown in FIG. 16, the direction of the easy magnetization axis 10 of the fixed layer P of the MTJ element MTJ inclines to the direction (Y direction) in which the word line WL extends. The easy magnetization axis 10 of the fixed layer P inclines, e.g., 30° to 60°, preferably, 45° to the direction (Y direction) in which the word line WL extends.

Accordingly, in the third embodiment as shown in FIG. 17, it is possible to take the value of the write current I2 in depressed portions of the asteroid curves, and reduce the write current I2 even in the case of uniaxial write.

[3-2] Effects

The third embodiment described above can achieve the same effect as in the first embodiment. In addition, the third embodiment can reduce the write current I2 for magnetic field write by inclining the MTJ element MTJ to the direction in which the word line WL extends.

[4] Fourth Embodiment

The fourth embodiment is an example in which a yoke layer YK of a word line WL is extended closer to a fixed layer P.

[4-1] Sectional Structure of Memory Cell

Figure 18:
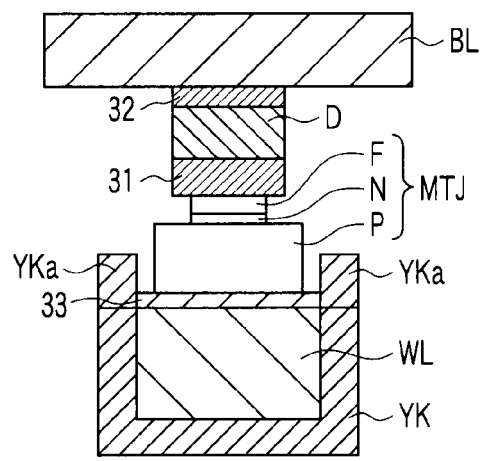
FIG. 18 is a sectional view of a memory cell of a magnetic random access memory according to the fourth embodiment of the present invention.
Figure 19:
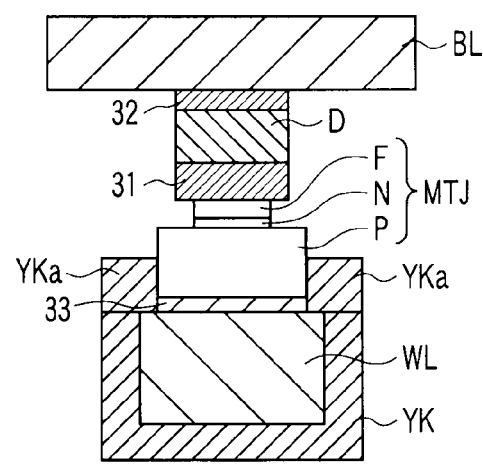
FIG. 19 is a sectional view of another memory cell of the magnetic random access memory according to the fourth embodiment of the present invention.

FIGS. 18 and 19 are sectional views of a memory cell of a magnetic random access memory according to the fourth embodiment of the present invention. The sectional structures of the memory cell of the magnetic random access memory according to the fourth embodiment will be explained below.

In the fourth embodiment as shown in FIG. 18, the yoke layer YK covers the side surfaces and bottom surface of the word line WL, and yoke layers YKa are additionally formed on the side surfaces of the fixed layer P, in order to efficiently apply a current magnetic field H of the word line WL to the fixed layer P.

The yoke layers YKa are formed on the yoke layer YK, and surround at least portions of the side surfaces of the fixed layer P. Referring to FIG. 18, the yoke layers YKa are insulated from the fixed layer P. However, the yoke layers YKa may also be in contact with the fixed layer P as shown in FIG. 19.

[4-2] Effects

The fourth embodiment described above can achieve the same effect as in the first embodiment. In addition, the fourth embodiment can further efficiently apply the magnetic field H generated by the write current I2 to the fixed layer P by forming the yoke layers YKa on the side surfaces of the fixed layer P. This makes it possible to reduce the write current I2 for reversing magnetization in the fixed layer P.

[5] Fifth Embodiment

The fifth embodiment is an example of page write.

[5-1] Write Operation

Figure 20:
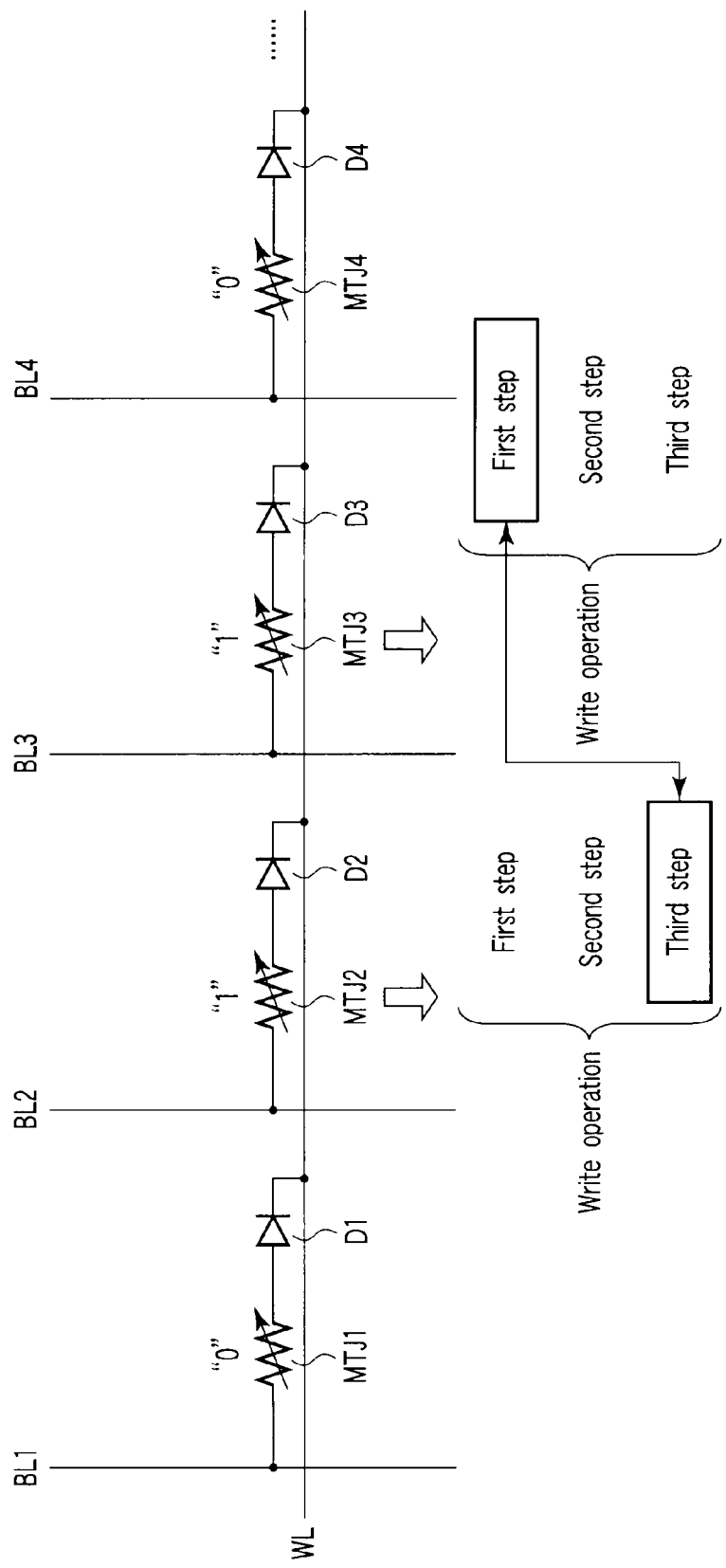
FIG. 20 is a view for explaining a write operation according to the fifth embodiment of the present invention.

FIG. 20 is a view for explaining the write operation of a magnetic random access memory according to the fifth embodiment of the present invention. The write operation of the magnetic random access memory according to the fifth embodiment will be explained below.

As shown in FIG. 20, MTJ elements MTJ1, MTJ2, MTJ3, and MTJ4 connected to the same word line WL are regarded as elements on the same page. The memory has a mode in which data is written for each page.

Assume that "0" is to be written in the MTJ elements MTJ1 and MTJ4, and "1" is to be written in the MTJ elements MTJ2 and MTJ3. In this case, data "0" is first written in the MTJ elements MTJ2 and MTJ3 in one page, and data "1" is written in the MTJ elements MTJ1 and MTJ2 after that. In this data write operation, of the first and third steps (magnetic field write) of second data write shown in FIG. 5, the third step of the MTJ element MTJ2 and the first step of the MTJ element MTJ3 may also be omitted.

[5-2] Effects

The fifth embodiment described above can achieve the same effect as in the first embodiment. In addition, the fifth embodiment can shorten the write time by writing data for each page.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:
   a first interconnection extending to a first direction;
   a second interconnection extending to a second direction perpendicular to the first direction;
   a magnetoresistive effect element formed between the first interconnection and the second interconnection at an intersection of the first interconnection and the second interconnection, having one terminal connected to the first interconnection, comprising a fixed layer, a recording layer, and a nonmagnetic layer formed between the fixed layer and the recording layer, a film thickness of the fixed layer being larger than that of the recording layer, and a width of the fixed layer being larger than that of the recording layer, and configured to reverse a magnetization direction in the recording layer by supplying a first electric current between the fixed layer and the recording layer; and
   a diode having one terminal connected to the other terminal of the magnetoresistive effect element, and the other terminal connected to the second interconnection, and configured to supply the first electric current in only one direction.

2. The memory according to claim 1, wherein magnetization in the fixed layer and the recording layer is parallel to a film surface.

3. The memory according to claim 1, further comprising:
   a first write driver connected to one of the first interconnection and the second interconnection, and configured to supply the first electric current in one direction; and
   a second write driver connected to the other one of the first interconnection and the second interconnection, and configured to supply a second electric current in two directions.

4. The memory according to claim 3, wherein the fixed layer is positioned closer to the other one of the first interconnection and the second interconnection than the recording layer.

5. The memory according to claim 1, wherein a coercive force of the fixed layer is smaller than that of the recording layer.

6. The memory according to claim 1, wherein an area of a planar shape of the fixed layer is larger than that of a planar shape of the recording layer.

7. The memory according to claim 1, wherein a direction of an easy magnetization axis of the fixed layer is one of the first direction and the second direction.

8. The memory according to claim 1, wherein a direction of an easy magnetization axis of the fixed layer inclines 45° to one of the first direction and the second direction.

9. The memory according to claim 1, further comprising a first yoke layer formed by a magnetic material on at least one surface, except for a surface opposing the magnetoresistive effect element, of at least one of the first interconnection and the second interconnection to which a second electric current is supplied.

10. The memory according to claim 9, further comprising a second yoke layer formed in contact with the first yoke layer, and surrounding side surfaces of the fixed layer.

11. The memory according to claim 10, wherein the second yoke layer is in contact with the fixed layer.

12. The memory according to claim 1, wherein cells each having the first interconnection, the second interconnection, the magnetoresistive effect element, and the diode are stacked perpendicularly to a substrate.

13. A write method of a magnetic random access memory including a first interconnection extending to a first direction;

a second interconnection extending to a second direction perpendicular to the first direction;

a magnetoresistive effect element formed between the first interconnection and the second interconnection at an intersection of the first interconnection and the second interconnection, having one terminal connected to the first interconnection, and comprising a fixed layer, a recording layer, and a nonmagnetic layer formed between the fixed layer and the recording layer, a film thickness of the fixed layer being larger than that of the recording layer, and a width of the fixed layer being larger than that of the recording layer; and a diode having one terminal connected to the other terminal of the magnetoresistive effect element, and the other terminal connected to the second interconnection, the method comprising:

in the case of writing first data in the magnetoresistive effect element, reversing magnetization in the recording layer by supplying a first electric current between the fixed layer and the recording layer, and in the case of writing second data in the magnetoresistive effect element, generating a first magnetic field by supplying a second electric current to one of the first interconnection and the second interconnection, and reversing only magnetization in the fixed layer by applying the first magnetic field to the fixed layer, reversing magnetization in the recording layer by supplying a third electric current between the fixed layer and the recording layer in the same direction as that of the first electric current, and generating a second magnetic field by supplying a fourth electric current to one of the first interconnection and the second interconnection in a direction opposite to that of the second electric current, and reversing only magnetization in the fixed layer by applying the second magnetic field to the fixed layer.

14. The method according to claim 13, wherein values of the first electric current and the third electric current are smaller than those of the second electric current and the fourth electric current.

15. The method according to claim 13, wherein before a write operation, magnetization in the fixed layer and the recording layer is parallel to a film surface.

16. The method according to claim 13, wherein a coercive force of the fixed layer is smaller than that of the recording layer.

17. The method according to claim 13, wherein the fixed layer is positioned closer, than the recording layer, to one of the first interconnection and the second interconnection to which the second electric current and the fourth electric current are supplied.

18. The method according to claim 13, wherein a direction of an easy magnetization axis of the fixed layer inclines 45° to one of the first direction and the second direction.

19. The method according to claim 13, further comprising providing a first yoke layer formed by a magnetic material on at least one surface, except for a surface opposing the magnetoresistive effect element, of one of the first interconnection and the second interconnection.

20. The method according to claim 19, further comprising providing a second yoke layer formed in contact with the first yoke layer, and surrounding side surfaces of the fixed layer.

* * * * *